United States Patent
Casterton et al.

(10) Patent No.: US 7,404,121 B2
(45) Date of Patent: Jul. 22, 2008

(54) METHOD AND MACHINE-READABLE MEDIA FOR INFERRING RELATIONSHIPS BETWEEN TEST RESULTS

(75) Inventors: Kristin Noel Casterton, Fort Collins, CO (US); Carli Connally, Fort Collins, CO (US); Ryan Lessman, Loveland, CO (US)

(73) Assignee: Verigy (Singapore) Pte. Ltd., Singapore (SG)

( * ) Notice: Subject to any disclaimer, the term of this patent is extended or adjusted under 35 U.S.C. 154(b) by 216 days.

(21) Appl. No.: 11/345,047

(22) Filed: Jan. 31, 2006

(65) Prior Publication Data

US 2007/0208972 A1    Sep. 6, 2007

(51) Int. Cl.
*G01R 31/28* (2006.01)
(52) U.S. Cl. .................................................... 714/724
(58) Field of Classification Search .................. 714/724
See application file for complete search history.

(56) References Cited

U.S. PATENT DOCUMENTS

| | | | |
|---|---|---|---|
| 5,819,280 A * | 10/1998 | Nagai | 707/103 R |
| 6,925,589 B1 * | 8/2005 | Ben-Ezri | 714/724 |
| 6,961,674 B2 * | 11/2005 | Gedamu et al. | 702/183 |
| 6,988,232 B2 * | 1/2006 | Ricchetti et al. | 714/736 |
| 7,039,753 B2 * | 5/2006 | Suzuki et al. | 711/102 |
| 2004/0207387 A1 * | 10/2004 | Chung et al. | 324/158.1 |

* cited by examiner

*Primary Examiner*—James C Kerveros
(74) *Attorney, Agent, or Firm*—Holland & Hart, LLP

(57) ABSTRACT

In one embodiment, a method for inferring relationships between test results receives sequential test data from a tester performing tests on a number of devices under test (DUTs); upon receiving a DUT identifier, determines if a data structure exists for the DUT identified by the one of the DUT identifiers; upon determining that the data structure does not exist, creates the data structure associates i) any test results associated with the one of the DUT identifiers with ii) the data structure; and upon determining that the data structure exists, creates a child data structure, as a child of the data structure, and associates i) the any test results associated with the one of the DUT identifiers with ii) the child data structure, wherein the child data structure inferentially indicates that the test results associated therewith are retest results.

20 Claims, 2 Drawing Sheets

METHOD AND MACHINE-READABLE MEDIA FOR INFERRING RELATIONSHIPS BETWEEN TEST RESULTS

BACKGROUND

Testers such as the 93000 SOC (System On a Chip) Series tester offered by Agilent Technologies, Inc. provide rapid testing of complex circuitry. Such testers can produce massive quantities of sequential test data, with the test results contained in the sequential test data being associated with relatively few indicators as to what kind of testing led to the creation of particular ones or sets of the test results. Simple ways to infer relationships between the test results are therefore useful.

SUMMARY OF THE INVENTION

In one embodiment, a method for inferring relationships between test results comprises 1) receiving sequential test data from a tester performing tests on a number of devices under test (DUTs), the sequential test data comprising 1) a number of DUT identifiers, wherein ones of the DUT identifiers are followed by 2) any test results associated with an identified DUT; 2) upon receiving one of the DUT identifiers, determining if a data structure exists for the DUT identified by the one of the DUT identifiers; 3) upon determining that the data structure does not exist, creating the data structure and associating i) any test results associated with the one of the DUT identifiers with ii) the data structure; and 4) upon determining that the data structure exists, creating a child data structure, as a child of the data structure, and associating i) the any test results associated with the one of the DUT identifiers with ii) the child data structure. The child data structure inferentially indicates that the test results associated therewith are retest results.

In another embodiment, a number of machine-readable media have stored thereon sequences of instructions that, when executed by a machine, cause the machine to perform the actions of the method set forth in the preceding paragraph.

Other embodiments are also disclosed.

BRIEF DESCRIPTION OF THE DRAWINGS

Illustrative embodiments of the invention are illustrated in the drawings, in which.

DETAILED DESCRIPTION

Figure 1:
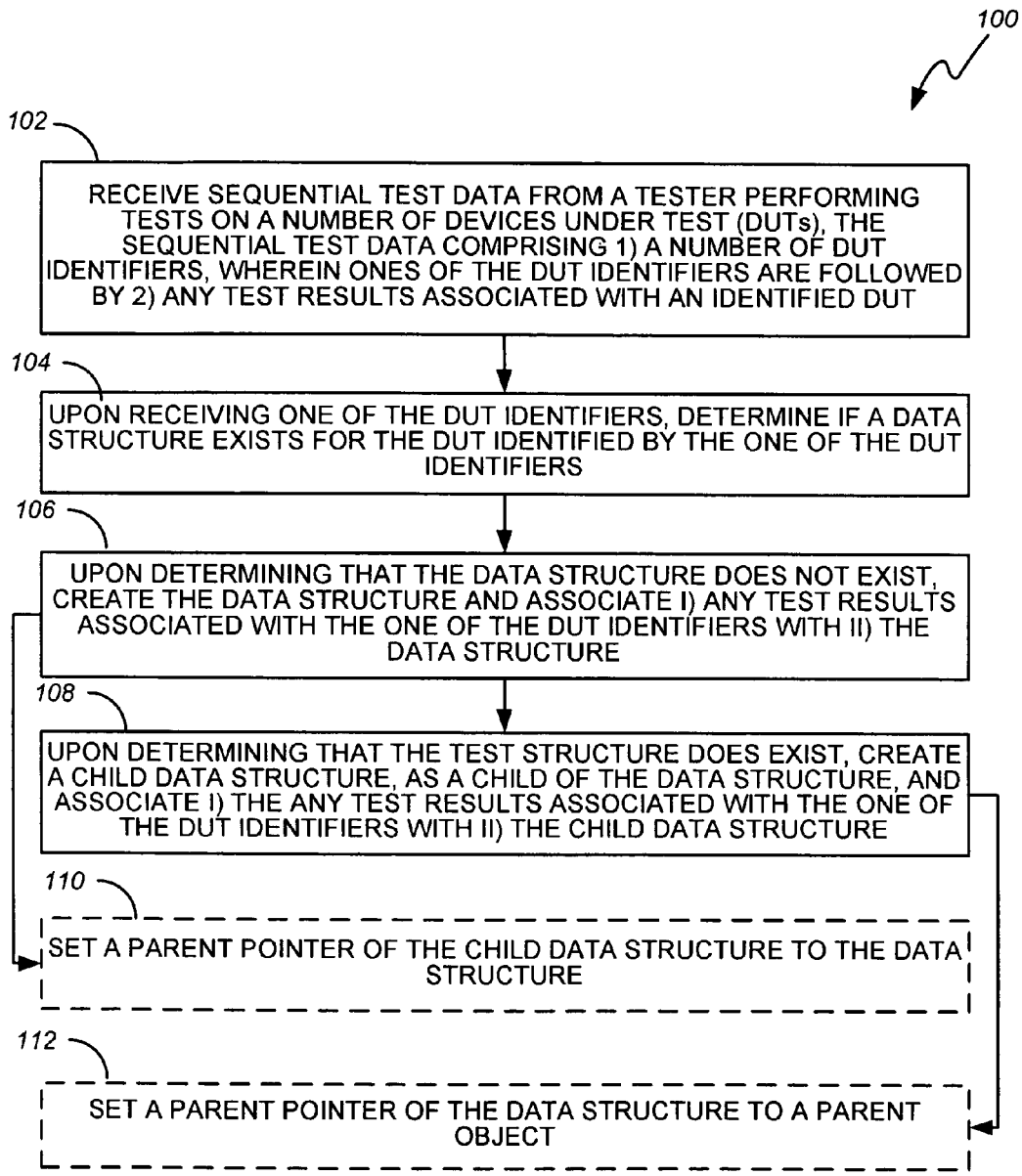
FIG. 1 illustrates an exemplary method for inferring relationships between test results.

As indicated in the Background, testers such as the 93000 SOC (System On a Chip) Series tester offered by Agilent Technologies, Inc. can produce massive quantities of sequential test data, with the test results contained in the sequential test data being associated with relatively few indicators as to what kind of testing led to the creation of particular ones or sets of the test results. Simple ways to infer relationships between the test results are therefore useful. To this end, FIG. 1 illustrates an exemplary method 100 for inferring relationships between test results.

The method 100 begins with the receipt of sequential test data from a tester that performs tests on a number of devices under test (DUTs). See block 102 of FIG. 1. In some cases, the sequential test data may be received directly from the tester, while in other cases, the sequential test data may be received by way of an intermediate data store, such as a file on disk or an in-memory data structure. The sequential test data comprises 1) a number of DUT identifiers, with ones of the DUT identifiers being followed by 2) any test results that are associated with an identified DUT. By way of example, the DUT identifiers may comprise locations of DUTs on a wafer, such as Cartesian coordinates (e.g., (x,y) coordinates) of the DUTs. The DUT identifiers may alternately comprise alpha or alphanumeric DUT identifiers. In addition, the DUT identifiers may comprise combinations of identifiers, such as Cartesian coordinates, a wafer identifier and a lot identifier.

Upon receiving one of the DUT identifiers, the method 100 determines if a data structure exists for the DUT that is identified by the DUT identifier (block 104). Upon determining that the data structure does not exist, the data structure is created, and any test results that are associated with the DUT identifier are associated with the newly created data structure (block 106). However, upon determining that the data structure already exists, a child data structure is created (as a child of the data structure), and any test results that are associated with the DUT identifier are associated with the child data structure. The unexpected dependency of the child data structure (i.e., a dependency on a parent data structure that is associated with the same DUT) inferentially indicates that the test results associated with the child data structure are retest results.

The ability to identify retest results, and distinguish them from initial test results, can be useful in that an inability to distinguish these results can skew data averages and other data interpretations.

Optionally, and upon creating a child data structure, the method 100 may comprise setting a "parent pointer" of the child data structure to point to the child's parent data structure (block 110). Similarly, and upon creating an initial data structure for a DUT, the method 100 may comprise setting a "parent pointer" of the data structure to point to a parent of the DUT's initial data structure (block 112). Alternately, pointers associated with parent data structures may be set to point to their children.

In one embodiment, the method 100 further comprises 1) determining if a DUT identifier is associated with any test results, and 2) if the DUT identifier is not associated with any test results, skipping the creation of an initial or child data structure for an identified DUT.

It is noted that the order of the method steps shown in FIG. 1 is not critical, and other orders of the steps, including parallel processing of the steps, is possible.

The method 100 shown in FIG. 1 may be implemented by means of sequences of instructions stored on machine-readable media that, when executed by a machine, cause the machine to perform the actions of the method 100. The machine-readable media may include, for example, any number or mixture of fixed or removable media (such as one or more fixed disks, random access memories (RAMs), read-only memories (ROMs), or compact discs), at either a single location or distributed over a network. The sequences of instructions will typically comprise software, but could also comprise firmware.

Figure 2:
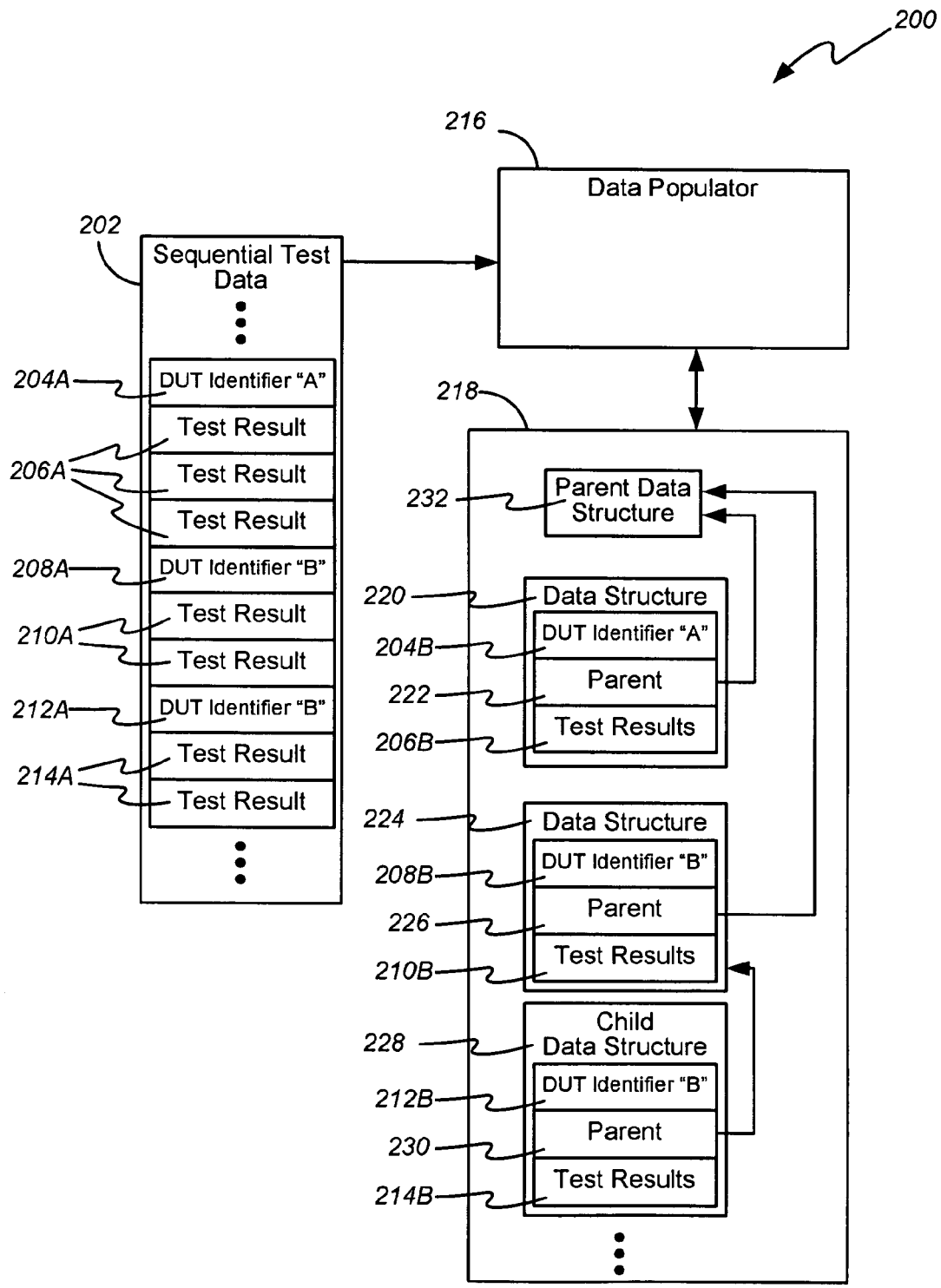
FIG. 2 illustrates an exemplary system for implementing the method of FIG. 1.

FIG. 2 illustrates a block diagram of an exemplary system 200 for implementing the method 100 (FIG. 1). The system 200 comprises a data populator 216 and a data store 218. The data populator 216 receives sequential test data 202, including DUT identifiers 204A, 208A, 212A and their associated test results 206A, 210A, 214A. In one embodiment, the sequential test data 202 may be received directly from a tester, while in other cases, the sequential test data 202 may be received by way of an intermediate data store, such as a file on disk or an in-memory data structure.

Upon receiving the DUT identifier 204A, the data populator 216 may access the data store 218 to determine if a data structure exists for the DUT "A". Upon finding that no such data structure exists, the data populator 216 may then create the data structure 220, associate the DUT identifier 204B and test results 206B with the data structure 220, and set a parent pointer 222 of the data structure 220 to a parent data structure 232 (e.g., a "wafer" data structure).

Upon receiving the DUT identifier 208A, the data populator 216 may access the data store 218 to determine if a data structure exists for the DUT "B". Upon finding that no such structure exists, the data populator 216 may then create the data structure 224, associate the DUT identifier 208B and test results 210B with the data structure 224, and set a parent pointer 226 of the data structure 224 to the parent data structure 232.

Upon receiving the DUT identifier 212A, the data populator 216 may access the data store 218 to determine if a data structure exists for the DUT "B". Upon finding that a data structure already exists, the data populator 216 may then create the child data structure 228, associate the DUT identifier 212B and test results 214B with the data structure 228, and set a parent pointer 230 of the data structure 228 to the initial data structure 224 that was created for the DUT "B".

In one embodiment, each of the data structures 220, 224, 228, 232 is a data object created in memory. However, the data structures 220, 224, 228, 232 could also comprise database records, files or custom structures (e.g., "structs").

What is claimed is:

1. A method for inferring relationships between test results, comprising:
   receiving sequential test data from a tester performing tests on a number of devices under test (DUTs), the sequential test data comprising a number of DUT identifiers, wherein ones of the DUT identifiers are followed by any test results associated with an identified DUT;
   upon receiving one of the DUT identifiers, determining if a data structure exists for the DUT identified by the one of the DUT identifiers;
   upon determining that the data structure does not exist, creating the data structure and associating i) any test results associated with the one of the DUT identifiers with ii) the data structure; and
   upon determining that the data structure exists, creating a child data structure, as a child of the data structure, and associating i) the any test results associated with the one of the DUT identifiers with ii) the child data structure, wherein the child data structure inferentially indicates that the test results associated therewith are retest results.

2. The method of claim 1, further comprising, setting a parent pointer of the child data structure to the data structure.

3. The method of claim 1, further comprising, setting a parent pointer of the data structure to a parent object.

4. The method of claim 1, further comprising, upon receiving the one of the DUT identifiers:
   determining if the one of the DUT identifiers is associated with any test results; and
   if the one of the DUT identifiers is not associated with any test results, not creating the data structure or the child data structure.

5. The method of claim 1, wherein the data structure and child data structure, if created, are created as data objects.

6. The method of claim 1, wherein the DUT identifiers comprise locations of DUTs on a wafer.

7. The method of claim 6, wherein the DUT identifiers further comprise wafer identifiers.

8. The method of claim 1, wherein receiving the sequential test data from the tester comprises receiving the sequential test data by way of an intermediate data store.

9. The method of claim 8, wherein the data store is a file.

10. The method of claim 1, wherein plural sets of retest results are respectively associated with plural child data structures of the data structure.

11. A number of machine-readable media having stored thereon sequences of instructions that, when executed by a machine, cause the machine to perform the actions of:
    receiving sequential test data from a tester performing tests on a number of devices under test (DUTs), the sequential test data comprising a number of DUT identifiers, wherein ones of the DUT identifiers are followed by any test results associated with an identified DUT;
    upon receiving one of the DUT identifiers, determining if a data structure exists for the DUT identified by the one of the DUT identifiers;
    upon determining that the data structure does not exist, creating the data structure and associating i) any test results associated with the one of the DUT identifiers with ii) the data structure; and
    upon determining that the data structure exists, creating a child data structure, as a child of the data structure, and associating i) the any test results associated with the one of the DUT identifiers with ii) the child data structure, wherein the child data structure inferentially indicates that the test results associated therewith are retest results.

12. The media of claim 11, wherein the sequences of instructions, when executed by the machine, further cause the machine to set a parent pointer of the child data structure to the data structure.

13. The media of claim 11, wherein the sequences of instructions, when executed by the machine, further cause the machine to set a parent pointer of the child data structure to a parent object.

14. The media of claim 11, wherein the sequences of instructions, when executed by the machine, further cause the machine to, upon receiving the one of the DUT identifiers:
    determine if the on of the DUT identifiers is associated with any test results; and
    if the one of the DUT identifiers is not associated with any test results, not create the data structure of the child data structure.

15. The media of claim 11, wherein the structure of child data structure, if created are created as data objects.

16. The media of claim 11, wherein the DUT identifiers comprise locations of DUTs on a wafer.

17. The media of claim 16, wherein the DUT identifiers further comprise wafer identifiers.

18. The media of claim 11, wherein receiving the sequential test data from the tester comprises receiving the sequential test data by way of an intermediate data store.

19. The media of claim 18, wherein the data store is a file.

20. The media of claim 11, wherein the sequences of instructions, when executed by the machine, further cause the machine to respectively associate plural sets of retest results with plural child data structures of the data structure.

* * * * *